US012729455B2

(12) United States Patent
Blazek et al.

(10) Patent No.: US 12,729,455 B2
(45) Date of Patent: Sep. 8, 2026

(54) METHOD OF PRODUCING A CRYSTAL FOR A SCINTILLATION CRYSTAL DETECTOR AND A CRYSTAL FOR A SCINTILLATION CRYSTAL DETECTOR

(71) Applicants: CRYTUR, spol. s r.o., Turnov (CZ); Fyzikalni ustav AV CR, v.v.i., Prague (CZ)

(72) Inventors: Karel Blazek, Turnov (CZ); Martin Nikl, Prague (CZ); Jan Tous, Mirova pod Kozakovem (CZ); Karel Bartos, Turnov (CZ); Jan Polak, Turnov (CZ); Tomáš Marek, Prague (CZ)

(73) Assignees: CRYTUR, spol. s r.o., Turnov (CZ); Fyzikalni ustav AV CR, v.v.i., Prague (CZ)

( * ) Notice: Subject to any disclaimer, the term of this patent is extended or adjusted under 35 U.S.C. 154(b) by 185 days.

(21) Appl. No.: 18/519,129

(22) Filed: Nov. 27, 2023

(65) Prior Publication Data

US 2024/0183061 A1 Jun. 6, 2024

(51) Int. Cl.
*C30B 15/04* (2006.01)
*C01F 17/34* (2020.01)
(Continued)

(52) U.S. Cl.
CPC .............. *C30B 15/04* (2013.01); *C01F 17/34* (2020.01); *C09K 11/7774* (2013.01);
(Continued)

(58) Field of Classification Search
CPC ......... C30B 15/04; C30B 15/00; C30B 29/24; C30B 33/02; C01P 2002/52; C01P 2006/60; C01F 17/34; C09K 11/7774
See application file for complete search history.

(56) References Cited

U.S. PATENT DOCUMENTS

2013/0291788 A1* 11/2013 Houzvicka .............. C30B 15/22 117/15
2018/0284300 A1* 10/2018 Houzvicka ....... C09K 11/77742

FOREIGN PATENT DOCUMENTS

CN 104818023 A 8/2015
CN 108330541 A * 7/2018 ............ C30B 29/24
(Continued)

OTHER PUBLICATIONS

Kamada Kei et al.: "Crystal growth and scintillation properties of Ce doped (Gd,Y) AlO3 perovskite single crystals", Physica Status Solidi. C: Current Topics in Solid State Physics. vol. 9, No. 12, Dec. 1, 2012, pp. 2263-2266, XP093149476, ISSN: 1862-6351. DOI: 10.1002/pssc.201200264.

*Primary Examiner* — Robert M Kunemund
(74) *Attorney, Agent, or Firm* — Rivka Friedman

(57) ABSTRACT

The invention relates to a method of producing a crystal from a material with the general composition of $Ce_xGd_yY_{1-x-y}AlO_3$ known to the professional public for scintillation crystal detectors, which has not yet been industrially produced by the Czochralski method. The invented method makes it possible to produce crystals with a diameter larger than units of mm. In particular, the invention adds to the initial Czochralski method the steps of annealing the input raw materials as well as the controlled flow of a reducing hydrogen-argon atmosphere through a crystal growth furnace.

8 Claims, 3 Drawing Sheets

(51) Int. Cl.

| | |
|---|---|
| ***C09K 11/77*** | (2006.01) |
| ***C30B 15/20*** | (2006.01) |
| ***C30B 29/24*** | (2006.01) |
| ***C30B 33/02*** | (2006.01) |
| ***G01T 1/202*** | (2006.01) |

(52) U.S. Cl.

CPC .............. *C30B 15/20* (2013.01); *C30B 29/24* (2013.01); *C30B 33/02* (2013.01); *G01T 1/2023* (2013.01); *C01P 2002/52* (2013.01); *C01P 2006/60* (2013.01)

(56) References Cited

FOREIGN PATENT DOCUMENTS

| | | | | |
|---|---|---|---|---|
| EP | 2758489 | B1 | | 4/2016 |
| EP | 3633081 | A1 | | 4/2020 |
| JP | 2016084376 | A | * | 5/2016 |

* cited by examiner

METHOD OF PRODUCING A CRYSTAL FOR A SCINTILLATION CRYSTAL DETECTOR AND A CRYSTAL FOR A SCINTILLATION CRYSTAL DETECTOR

FIELD OF THE INVENTION

The invention relates to a method of producing a Ce:(Gd,Y)$AlO_3$ crystal, in particular for use in scintillation crystal detectors.

BACKGROUND OF THE INVENTION

The technical article "Crystal growth and scintillation properties of Ce doped (Gd,Y)$AlO_3$ perovskite single crystals" (Kei Kamanda, Takanori Endo, Kousuke Tsutsumi) (https://doi.org/10.1002/pssc.201200264) discusses the crystalline material Ce:(Gd,Y)$AlO_3$, which shows very favourable properties for use in scintillation crystal detectors.

Ce:(Gd,Y)$AlO_3$ crystals are grown by the "micro-pulling-down" method (μ-PD method), as described in the above-mentioned technical article, in which crystal growth is realized by supplying melt through micro channels created at the bottom of a crucible. As for the above-mentioned method of producing a Ce:(Gd,Y)$AlO_3$ crystal, the article for experts defines the production parameter of the pulling velocity of crystal from the melt, then the type of seed crystal, and then the heating technology. At the same time, input raw materials for the production of a melt are defined to produce a single crystal with the general composition $Ce_xGd_yY_{1-x-y}AlO_3$.

As for the published method of production by the μ-PD method, the professional public is aware of its shortcomings, which primarily include the limited size of the produced crystals. In the article, the size of the grown crystals was stated to be about 3 mm×30 cm. Furthermore, the disadvantage is the limited expansion of the technology for the mass implementation of the μ-PD method. Both of the above-mentioned disadvantages are reflected in the price of the produced crystals, and subsequently in the price of scintillation crystal detectors. Also, the limited size of the single crystals produced from Ce:(Gd,Y)$AlO_3$ greatly hinders the development of applications with scintillation crystal detectors.

The professional public is also aware of the method of producing crystals by the so-called Czochralski method, which is widespread on a worldwide scale, which allows the production of crystals with a precisely defined crystallographic orientation with a very regular crystal lattice, and at the same time enables the growth of a crystal with a diameter from units to hundreds of mm. The use of the Czochralski method to produce crystals from Ce:(Gd,Y)$AlO_3$ would increase the production volume of crystals from Ce:(Gd,Y)$AlO_3$, which will have a positive effect on the market availability of Ce:(Gd,Y)$AlO_3$ crystals. In addition, the larger sizes of the produced crystals would make it possible to develop new applications in scintillation crystal detectors.

Unfortunately, at the date of filing this application for registration of the invention, the applicant is not aware of a reliable and mass-applicable method of producing Ce:(Gd,Y)$AlO_3$ crystals realized by the Czochralski method which would allow the production of crystals with a diameter greater than units of mm.

The professional public is aware, for example, of the invention from document EP 3 633 081 (A1), which describes the procedure of growing a crystal by the Czochralski method from a material with the general composition $((Gd_{1-r}Y_r)_{1-s-x}Me_xCe_x)_{3-z}(Ga_{1-y-q}Al_yTi_q)_{5+z}O_{12}$, where the Me substituent is for one of the chemical elements from the group of Mg, Ca, Sr, Ba.

Whether the professional public may be aware of the invention from document CN 108 486 647 (A) in which a device for implementing the Czochralski method is presented, and furthermore a material with the general composition $Re_x$:$Ce_{(1-x)}AlO_3$, in which the substituent Re is an element from the group of Sm, Lu, La, Yb, Nd, Ho, Pr, Er, Tm, Eu, Tb or Dy.

However, none of the above-mentioned inventions can be considered to be transferred to the production of Ce:(Gd,Y)$AlO_3$ crystals, because any change in the composition or production steps changes the behaviour of the entire crystal growth process, including the resulting crystal.

The task of the invention is to develop a method of producing a Ce:(Gd,Y)$AlO_3$ crystal for a scintillation crystal detector, in particular for use in scintillation crystal detectors, which would use for production the Czochralski method, while the produced crystals would be materially pure, without above-limit defects of crystal lattices, and which could be produced in sizes with a crystal diameter above units of mm.

SUMMARY OF THE INVENTION

The task is achieved by using a method of producing a crystal for a scintillation crystal detector developed in accordance with the invention below.

The method of producing a crystal with the general composition of $Ce_xGd_yY_{1-x-y}AlO_3$ for a scintillation crystal detector is based on the production of a crystal by the Czochralski method by pulling a crystal from a molybdenum or tungsten crucible in the reducing atmosphere of a crystal growth furnace, where x is in the range from 0.005 to 0.015 and y is in the range from 0.4 to 0.6. In the method, a) the input raw materials are prepared, b) the input raw materials are placed in the crucible, and c) the content of the crucible is melted under the reducing atmosphere of the crystal growth furnace under the action of heat, and a crystal is produced by pulling.

The summary of the invention is based on the input raw materials being annealed in the presence of fluoride ions for the production of a crystal with the general composition of $Ce_xGd_yY_{1-x-y}AlO_3$ by the Czochralski method, as part of process step a). This is advantageous as it increases the reactivity of the input raw materials, which subsequently stabilizes the perovskite phase, and further facilitates the reduction of the $Ce^{4+}$ charge state. Furthermore, it is essential for the invention that during process step c) the reducing atmosphere of the crystal growth furnace is formed by a gaseous mixture of argon and hydrogen, while the reducing atmosphere is allowed to flow through the crystal growth furnace, and at the same time the flow rate of the reducing atmosphere ranges from $1.67\times10^{-7}$ m$^3$/s to $1.39\times10^{-5}$ m$^3$/s. The composition of the reducing atmosphere and its circulation through the crystal growth furnace has the advantage of significantly reducing the residual water content in the crystal growth furnace, which results from unreduced $CeO_2$ and which gives rise to fine particles from the crucible and the shielding system materials of the crystal growth furnace that tend to become embedded in the form of inclusions in the crystal. Inclusions increase the process of formation of scattering and colour centres, including charge traps, which negatively affects the light yield and scintillation response of the produced crystal. In addition, the circulation of the reducing atmosphere is preferred as it leads to thermodynamic stabilization of the perovskite phase during crystal growth.

It is preferred if argon makes up 5 to 95% of the volume of the reducing atmosphere and hydrogen makes up 95 to 5% of the volume of the reducing atmosphere, while the composition of the reducing atmosphere remains the same throughout the crystal production. At the same time, within the scope of the preferred embodiment of the invention, the input raw materials are $Gd_2O_3$, $Y_2O_3$, $Al_2O_3$ and $CeO_2$.

The embodiment of the invention is also preferred, in which process step c) is followed by process step d), in which the produced crystal or semi-finished products prepared from the crystal are heated in a circulating reducing atmosphere consisting of hydrogen with 0 to 99% by volume of at least one complementary gas from the group of argon, helium, neon, krypton, xenon. Heating helps to stabilize the crystal lattice to prevent the formation of tension or undesired changes due to undesired inclusions. Preferably, the reducing atmosphere in step d) has a temperature in the range from 1000° ° C. to 1500° ° C., while the heating time ranges from 50 hours to 100 hours.

It is advantageous for the invention if $NH_4F$ is used in process step a). The mentioned fluoride has been shown to beneficially increase the reactivity of the input raw materials. Preferably, the concentration of $NH_4F$ in step a) is 0.1 to 1% by weight in proportion to the input raw materials.

As the last mentioned, but no less preferred, embodiment of the method in accordance with the invention is the method in which the gadolinium-to-yttrium ratio is set in the range of $0.4<y<0.6$ as part of process step b). Crystals grown after complying with the condition set out above showed the most favourable scintillation properties for application in scintillation crystal detectors.

In addition, the invention includes a crystal produced by the invented method, the advantages of which are that it has the general composition of $Ce_xGd_yY_{1-x-y}AlO_3$ and that its diameter is between 30 and 60 mm. This is an industrially produced crystal that has not yet been available to the professional public. Until now, there were mainly laboratory produced samples and small quantities.

The main benefit of the invention is that it brings industrially produced crystals with the general composition of $Ce_xGd_yY_{1-x-y}AlO_3$ for crystal scintillation detectors, while the material has existed to date mainly as specially laboratory produced crystals. The use of the Czochralski growing method will enable the mass production of large crystals. The invention can maintain the stability of the crystal lattice during production, both in terms of chemical purity and structure. An industrially produced crystal has the same laboratory-verified scintillation properties as laboratory-grown crystals. Moreover, it is advantageous that the produced crystals can be large enough for new applications in scintillation crystal detectors, in particular in heavy scintillation detectors.

EXPLANATION OF DRAWINGS

The present invention will be explained in detail by means of the following figures where.

EXAMPLE OF THE INVENTION EMBODIMENTS

Figure 1:
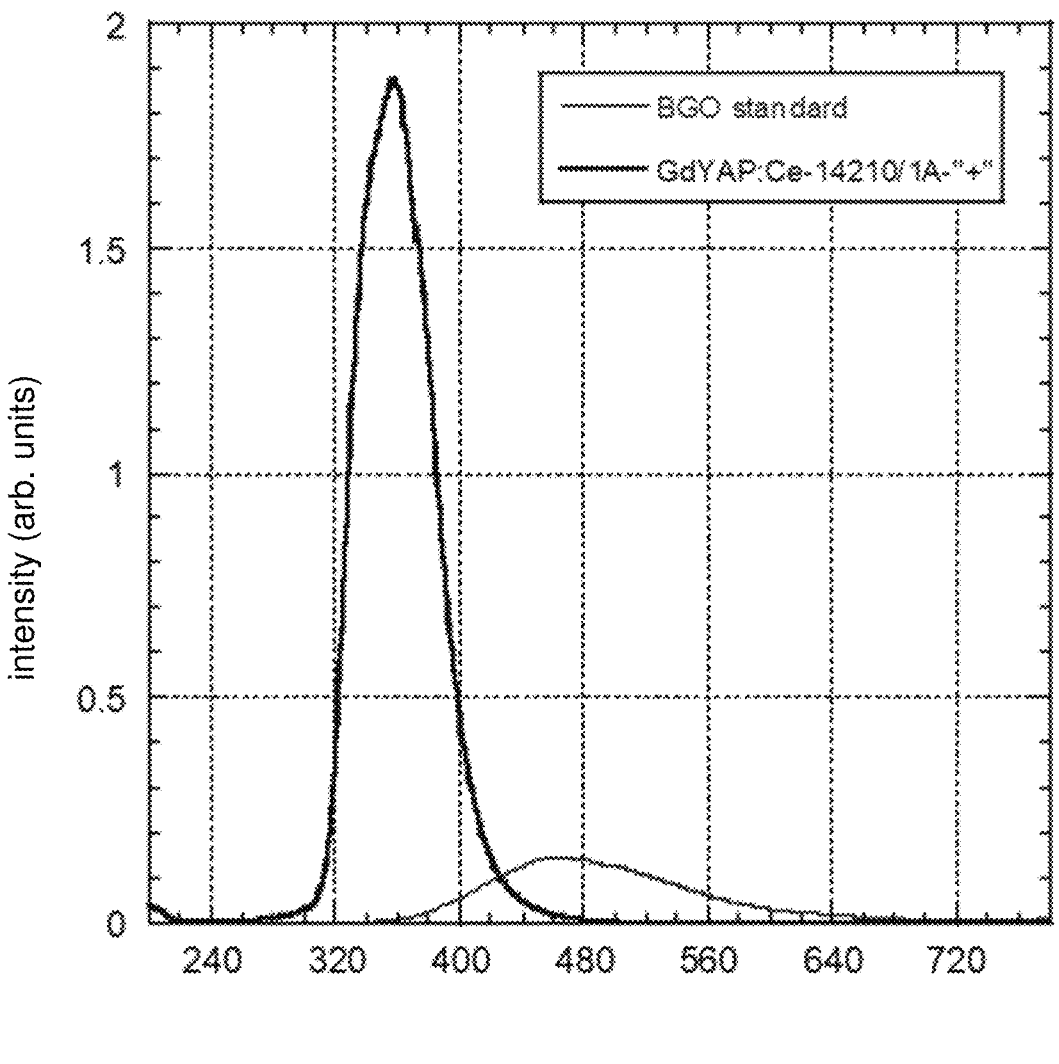
FIG. 1 presents a graph comparing the radioluminescence spectra of the crystal produced in accordance with the invention (Example 1) and the reference material.

It shall be understood that the specific cases of the invention embodiments described and depicted below are provided for illustration only and do not limit the invention to the examples provided here. Those skilled in the art will find or, based on routine experiment, will be able to provide a greater or lesser number of equivalents to the specific embodiments of the invention which are described here.

To produce a crystal with the general composition of $Ce_xGd_yY_{1-x-y}AlO_3$, a crystal growth furnace was modified to perform the Czochralski method, which is commonly used, for example, to grow single crystals of garnet or perovskite structure. A circuit for the circulation of the reducing atmosphere was connected to the crystal growth furnace, including cylinders containing hydrogen and argon and a mixing valve for precise adjustment of the ratio of the two gases. The circulation circuit included an adjustable valve and a flow meter for setting the flow rate of the gaseous mixture of the reducing atmosphere through the crystal growth furnace. Crystals were successfully produced at proportions of hydrogen within 5 to 95% of the total volume of the reducing atmosphere and argon within 5 to 95% of the total volume of the reducing atmosphere. Once the reducing atmosphere with the gas ratio in the crystal growth furnace was prepared, the argon-to-hydrogen ratio was no longer varied.

As for the parameters of circulation of the reducing atmosphere through the crystal growth furnace, the flow rate of the reducing atmosphere was chosen in the range from $1.67\times10^{-7}$ $m^3/s$ to $1.39\times10^{-5}$ $m^3/s$. Higher circulation rates disrupted the thermodynamic stability of the pulled crystal, while lower circulation rates resulted in a higher occurrence of undesired inclusions in the produced crystals.

For the industrial production of crystals, the input raw materials $Gd_2O_3$, $Y_2O_3$, $Al_2O_3$ and $CeO_2$ have been prepared, but it is not impossible that the expert could suggest alternative input raw materials, or other suitable input raw materials could be found in the future. Crystals for which the input raw materials met the condition of maintaining the gadolinium-to-yttrium ratio in the range of $0.4<y<0.6$ showed better results in the first reference scintillation tests than crystals produced from input raw materials with different gadolinium-to-yttrium ratio.

The input raw materials were annealed in the presence of fluoride ions, while practical experiments showed that $NH_4F$ was the most suitable material for the formation of fluoride ions, which substantially affected the initial reactivity of the input raw materials. The range of concentration of $NH_4F$ material was determined by experiment from 0.1 to 1% by weight in proportion to the input raw materials.

During the production of crystals and semi-finished products prepared from the crystals, it was necessary to heat the crystals and semi-finished products prepared from the crystals in a circulating reducing atmosphere, which was composed of hydrogen and of 0 to 99% by volume of at least one complementary gas from the group of argon, helium, neon, krypton, xenon. The annealing reducing atmosphere prevented the formation of structural changes in the structure of the produced crystals, as the structure of freshly produced crystal is sensitive to external factors, both in terms of chemical substances and sudden temperature changes.

Hydrogen is used as a reducing gas, while the presence of a complementary gas, which is at least one non-reactive noble gas, serves to prevent undesired chemical reactions from occurring.

It turned out that even after the crystal has been pulled, there are processes taking place in the crystal structure that need sufficient temperature and enough time to complete them successfully. Based on the experiments, annealing intervals in the temperature range from 1000° ° C. to 1500° C. and 50 hours to 100 hours time duration were statistically determined.

Industrially produced crystals with the general composition of $Ce_xGd_yY_{1-x-y}AlO_3$ were pulled in the form of single crystals, the diameter of which was from 30 mm to 60 mm.

Example 1

$Ce_{0.009}Gd_{0.5}Y_{0.491}AlO_3$ crystal is grown by the Czochralski method at a flow rate of $2\times10^{-7}$ $m^3/s$ in a protective atmosphere with a composition of 40% argon+60% hydrogen. The growth takes place in a 0.4 $dm^3$ molybdenum crucible in a furnace with resistance heating formed by tungsten loops. Raw material, prepared by isostatic pressing and annealing a mixture of oxides $Y_2O_3$, $Al_2O_3$, $Gd_2O_3$ and $CeO_2$ at 1500° C. with the addition of 0.5% by weight $NH_4F$ in the above stoichiometric ratio is weighed into the crucible in an amount of 5800 g. After melting, the raw material is homogenized by natural convection of the melt for 12 hours. After the melt is homogenized, a sample is taken out for stoichiometry analysis of the melt and the crystal growth starts at an oriented YAP <010> crystal seed rotating at 2 rpm. The velocity of pulling the crystal is 1.5 mm/hour. Crystal growth is controlled automatically by monitoring and evaluating weight increase over time.

After reaching the required length of the crystal, the crystallization process is completed by detouching the crystal from the melt. The crystal is then annealed in several steps.

In the temperature range of 1900° C.-1500° ° C. at a rate of $2.7\times10^{-2}$ s/K, in the range of 1500° C.-1000° C. at a rate of 0.08 s/K, and in the range of 1000° ° C. to room temperature at a rate of $2.7\times10^{-2}$ s/K. The temperature is monitored using a two-beam pyrometer.

The result is a clear single crystal with a weight of 950 g and a diameter of 32 mm.

Figure 2:
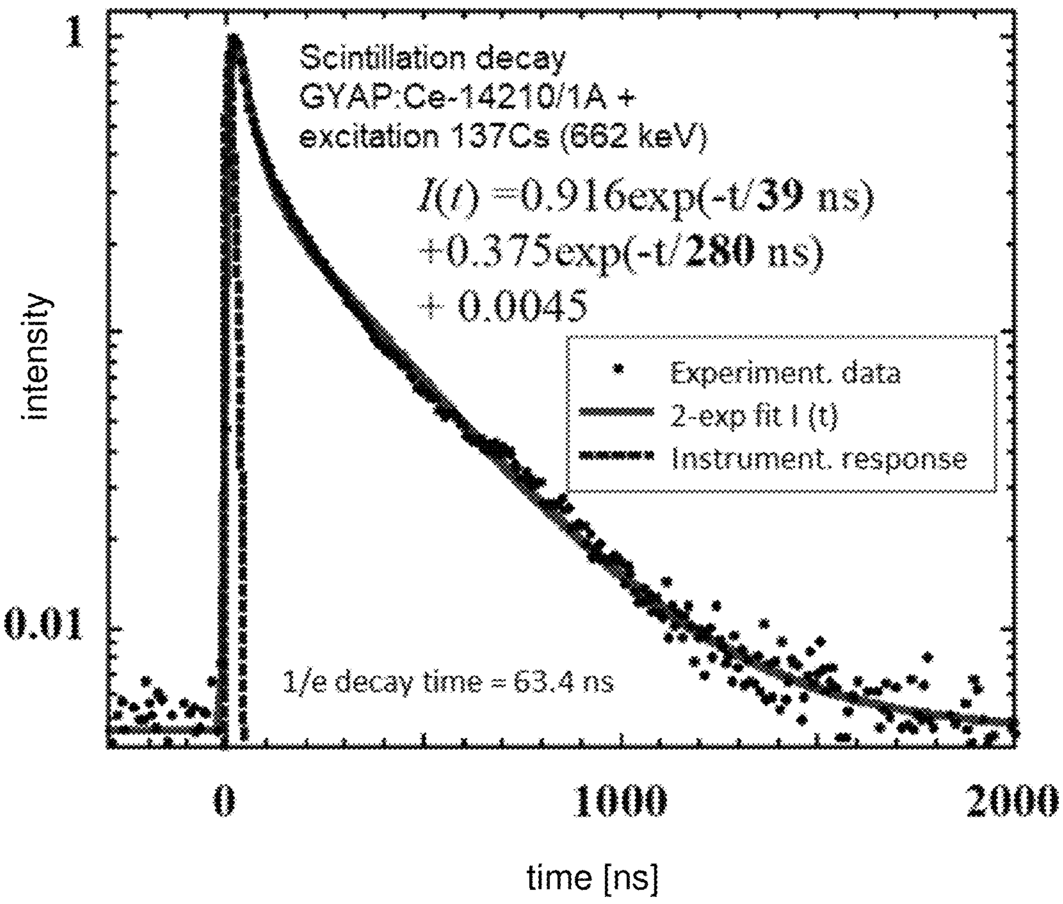
FIG. 2 presents a graph describing the scintillation decay of the crystal produced in accordance with the invention (Example 1)
Figure 3:
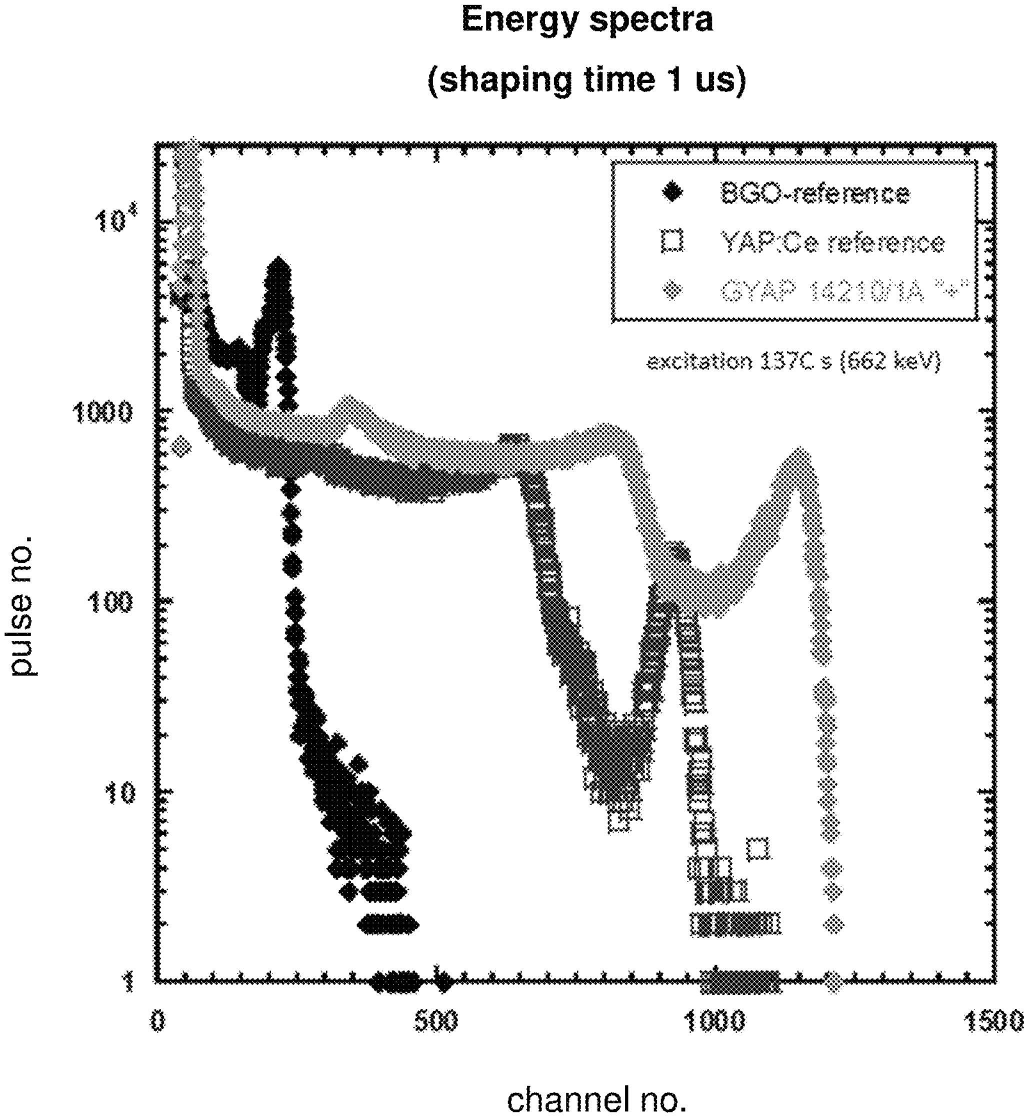
FIG. 3 presents a graph comparing the energy spectra of the crystal produced in accordance with the invention (Example 1) and the reference materials.

A double-sided Ø10×1 mm polished plate was prepared from the initial part of the crystal, on which the radioluminescence spectrum and scintillation decay were measured, from the latter the 1/e decay time was calculated. The energy (pulse-height) spectrum was measured as well from which the light yield and energy resolution at 662 keV were calculated. The graphs (FIGS. 1 to 3) and the table below present a comparison of the parameters of the crystal grown using the invention and the reference scintillators BGO and YAP:Ce with the same dimensions.

| Sample | 1/e decay time (ns) | Light yield (photons/MeV) | EnRes (%) @662 keV | Spectrum-maximum (nm) |
|---|---|---|---|---|
| GYAP:Ce 14210/1A "+" | 63.4 | 23990 | 4.1 | 356 |
| YAP:Ce reference | 35.1 | 19330 | 4.0 | 360 |
| BGO reference | 308 | 7380 | 8.0 | 480 |

Example 2

$Ce_{0.009}Gd_{0.55}Y_{0.441}AlO_3$ crystal is grown by the Czochralski method at a flow rate of $1\times10^{-6}$ $m^3/s$ in a protective atmosphere with a composition of 25% argon+75% hydrogen. The growth takes place in a 3 $dm^3$ molybdenum crucible in a furnace with resistance heating formed by tungsten loops. Raw material, prepared by isostatic pressing and annealing a mixture of oxides $Y_2O_3$, $Al_2O_3$, $Gd_2O_3$ and CeO2 at 1500° ° C. with the addition of 0.8% by weight $NH_4F$ in the above stoichiometric ratio is weighed into the crucible in an amount of 12400 g. After melting, the raw material is homogenized by natural convection of the melt for 12 hours. After the melt is homogenized, a sample is taken out for stoichiometry analysis of the melt and the crystal growth starts at an oriented YAP <010> crystal seed rotating at 2 rpm. The velocity of pulling the crystal is 1 mm/hour. Crystal growth is controlled automatically by monitoring and evaluating weight increase over time.

After reaching the required length of the crystal, the crystallization process is completed by detouching the crystal from the melt. The crystal is then annealed in several steps.

In the temperature range of 1900° C.-1500° ° C. at a rate of $2.0\times10^{-2}$ s/K, in the range of 1500° C.-1000 C at a rate of 0.1 s/K, and in the range of 1000° ° C. to room temperature at a rate of $2.0\times10^{-2}$ s/K. The temperature is monitored using a two-beam pyrometer.

The result is a clear single crystal with a weight of 4750 g and a diameter of 60 mm.

Subsequently, a Ø 1"×1" cylinder with polished faces was made and similar measurements as in Example 1 were made with the results presented in the table below.

| Sample | 1/e decay time (ns) | Light yield (photons/MeV) | EnRes (%) @662 keV | Spectrum-maximum (nm) |
|---|---|---|---|---|
| GYAP:Ce 14210/1A "+" | 67.5 | 17,640 | 7.1 | 358 |

INDUSTRIAL APPLICABILITY

A method of producing a crystal for a scintillation crystal detector and a crystal produced by the invented method will find their application in penetrating ionizing radiation detectors, in particular in research and industry.

The invention claimed is:

1. A method of producing a crystal for a scintillation crystal detector consisting in producing a crystal with the general composition of CexGdyY1-x-yAlO3 by the Czochralski method by pulling from a molybdenum or tungsten crucible under a reducing atmosphere of a crystal growing furnace, where x is from the range of 0.005 to 0.015 and y is from the range of 0.4 to 0.6, and within the framework of which a) the input raw materials are prepared, b) the input raw materials are placed in the crucible, c) the content of the crucible is melted under the reducing atmosphere of the crystal growing furnace under the action of heat and a crystal is produced by pulling, characterized in that as part of process step a), the input raw materials are annealed in the presence of fluoride ions, and, during process step c), the reducing atmosphere of the crystal growing furnace consists of a gaseous mixture of argon and hydrogen, while the reducing atmosphere is allowed to flow through the crystal growth furnace, and at the same time the flow rate of the reducing atmosphere ranges from 1.67×10 7 m3/s to 1.39×10-5 m3/s.

2. The method according to claim 1, characterized in that argon makes up 5-95% of the volume of the reducing atmosphere and hydrogen makes up 95-5% of the volume of the reducing atmosphere, while the composition of the reducing atmosphere remains the same throughout the crystal production.

3. The method according to claim 1, characterized in that the input raw materials are $Gd_2O_3$, $Y_2O_3$, $Al_2O_3$ and $CeO_2$.

4. The method according to claim 1, characterized in that process step c) is followed by process step d), in which the produced crystal or semi-finished products prepared from the crystal are annealed in a circulating reducing atmosphere consisting of hydrogen with 0-99% by volume of at least one complementary gas from the group of argon, helium, neon, krypton, xenon.

5. The method according to claim 4, characterized in that as part of process step d) the reducing atmosphere has a temperature in the range from 1000° C. to 1500° C., while the annealing time ranges from 50 hours to 100 hours.

6. The method according to claim 1, characterized in that $NH_4F$ is used as part of process step a).

7. The method according to claim 6, characterized in that the concentration of $NH_4F$ in step a) is 0.1 to 1% by weight in proportion to the input raw materials.

8. The method according to claim 1, characterized in that the ratio of gadolinium to yttrium is set in the range of $0.4<y<0.6$ as part of process step b).

* * * * *